(12) United States Patent
Lian (10) Patent No.: US 9,978,846 B2
(45) Date of Patent: May 22, 2018

(54) METHOD FOR FORMING STEPPED OXIDE ON A SUBSTRATE

(71) Applicant: Chengdu Monolithic Power Systems Co., Ltd., Chengdu (CN)

(72) Inventor: Yanjie Lian, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days. days.

(21) Appl. No.: 15/405,111

(22) Filed: Jan. 12, 2017

(65) Prior Publication Data

US 2017/0200793 A1    Jul. 13, 2017

(30) Foreign Application Priority Data

Jan. 13, 2016  (CN) .......................... 2016 1 0018432

(51) Int. Cl.
| | |
|---|---|
| *H01L 21/3205* | (2006.01) |
| *H01L 21/4763* | (2006.01) |
| *H01L 29/40* | (2006.01) |
| *H01L 29/78* | (2006.01) |
| *H01L 29/49* | (2006.01) |

(Continued)

(52) U.S. Cl.
CPC ........ *H01L 29/401* (2013.01); *H01L 21/0217* (2013.01); *H01L 21/0228* (2013.01); *H01L 21/02129* (2013.01); *H01L 21/02164* (2013.01); *H01L 21/02274* (2013.01); *H01L 21/28158* (2013.01); *H01L 21/31111* (2013.01); *H01L 21/31144* (2013.01); *H01L 21/32055* (2013.01); *H01L 21/32135* (2013.01); *H01L 21/32139* (2013.01); *H01L 29/42364* (2013.01);

(Continued)

(58) Field of Classification Search
CPC ............. H01L 29/7813; H01L 29/0649; H01L 29/7802; H01L 29/401; H01L 29/7816
See application file for complete search history.

(56) References Cited

U.S. PATENT DOCUMENTS 5,576,573 A * 11/1996 Su .......................... H01L 27/112
                                                      257/390
6,346,451 B1 * 2/2002 Simpson ............... H01L 21/266
                                                      257/134

(Continued)

OTHER PUBLICATIONS

U.S. Appl. No. 14/970,537, filed Dec. 15, 2015, Monolithic Power Systems.

*Primary Examiner* — Zandra Smith
*Assistant Examiner* — John M Parker
(74) *Attorney, Agent, or Firm* — Perkins Coie LLP (57) ABSTRACT

A method for forming a steeped oxide on a substrate is described: successively forming a first pad oxide layer, a nitride layer, a second pad oxide layer and a poly layer on the substrate; etching the poly layer to have an opening for the stepped oxide region; isotropically etching the second pad oxide layer to the nitride layer through the opening to form a stepped trench; isotropically etching the nitride layer to the first pad oxide layer through the opening to expand the stepped trench; filling the stepped trench with dielectric material to form a dielectric layer; planarizing the dielectric layer; removing the poly layer; removing the second pad oxide layer; removing the nitride layer; removing the portion of the first pad oxide layer uncovered by the dielectric layer such that the remaining first pad oxide layer together the remaining dielectric layer forms the stepped oxide.

22 Claims, 6 Drawing Sheets

(51) Int. Cl.
   *H01L 29/423* (2006.01)
   *H01L 21/02* (2006.01)
   *H01L 21/28* (2006.01)
   *H01L 21/311* (2006.01)
   *H01L 21/3213* (2006.01)
   *H01L 29/66* (2006.01)

(52) U.S. Cl.
   CPC .... *H01L 29/4916* (2013.01); *H01L 29/66681* (2013.01); *H01L 29/7816* (2013.01)

(56) References Cited

U.S. PATENT DOCUMENTS

| | | |
|---|---|---|
| 2014/0015017 A1 | 1/2014 | Yoo et al. |
| 2014/0151792 A1 | 6/2014 | Yoo et al. |
| 2015/0001619 A1 | 1/2015 | Yoo et al. |
| 2015/0187931 A1 | 7/2015 | Yoo et al. |

* cited by examiner

METHOD FOR FORMING STEPPED OXIDE ON A SUBSTRATE

CROSS-REFERENCE TO RELATED APPLICATIONS

This application claims the benefit of CN application 201610018432.4, filed on Jan. 13, 2016, and incorporated herein by reference.

TECHNICAL FIELD

The present invention generally relates to a method for forming a stepped oxide on a substrate, and more particularly, relates to a method for forming a stepped gate oxide for MOS (metal-oxide-semiconductor) devices in BCD (Bipolar, CMOS and DMOS) process.

BACKGROUND

In some applications for the fabrication of integrated circuits, it may be desirable to form stepped oxide on a substrate. For a LDMOS device, for example, it is advantageous if the dielectric of a gate electrode, the gate oxide, has a lower thickness on the source side than on the drain side, so that a stepped gate oxide is formed. This stepped gate oxide meets the demands for a lower turn-on resistance, i.e. a gate oxide as thin as possible, and for a high electrical strength, i.e. a gate oxide as thick as possible.

In the prior art, the forming methods are already known and described as so called dual gate oxide process in which after the deposition of a conventional gate oxide on a substrate using one mask several times etch to the deposited oxide using several more mask is required, so this method is not cost effective. Another disadvantage of the stepped gate oxide formed in this way is that the gate oxide could not be thick enough to withstand higher voltage, generally, the gate oxide thickness is only about 1000 angstroms and the performance of the entire device could be affected.

In light of foregoing, there is a need in the art to provide a better method for forming a stepped oxide on a substrate.

SUMMARY

The embodiments of the present invention are directed to methods for forming a stepped oxide on a substrate. One of the methods comprises the steps of: successively forming a first pad oxide layer, a nitride layer, a second pad oxide layer and a poly layer on the substrate; etching the poly layer to have an opening for the stepped oxide region; isotropically etching the second pad oxide layer to the nitride layer through the opening to form a stepped trench; isotropically etching the nitride layer to the first pad oxide layer through the opening to expand the stepped trench; filling the stepped trench with dielectric material to form a dielectric layer; planarizing the dielectric layer; removing the remaining poly layer; removing the remaining second pad oxide layer; removing the remaining nitride layer; removing the portion of the first pad oxide layer uncovered by the remaining dielectric layer such that the remaining first pad oxide layer together the remaining dielectric layer forms the stepped oxide.

BRIEF DESCRIPTION OF THE DRAWING

The present invention can be further understood with reference to the following detailed description and the appended drawings.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

FIGS. 1 to 13 are cross-sectional views showing the progression of manufacturing steps in forming a stepped oxide on a substrate according to an embodiment of the present invention. Several of the details of the embodiment will now be described below with reference to FIGS. 1-13.

Figure 1:
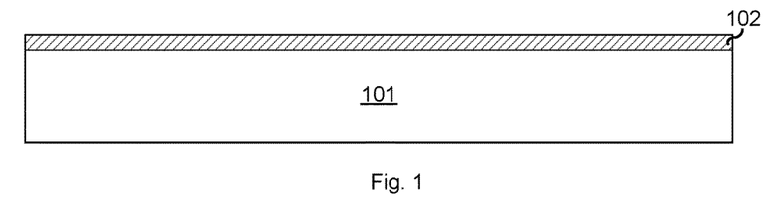
FIGS. 1 to 13 are cross-sectional views showing the progression of manufacturing steps in forming a stepped oxide on a substrate according to an embodiment of the present invention.
Figure 2:
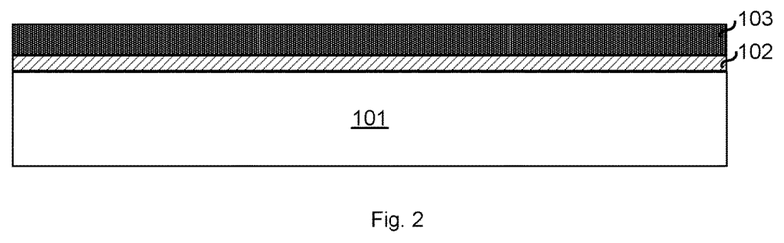

As shown in FIG. 1, at first a first pad oxide layer 102 is formed on a substrate 101. The first pad oxide layer 102 typically comprises silicon oxide and can be thermally grown on the substrate 101 or deposited by chemical vapor deposition (CVD). The first pad oxide layer 102 is formed at a thickness about 400 Å to 600 Å. Then as shown in FIG. 2, a nitride layer 103 is formed on the first pad oxide layer 102. The first pad oxide layer 102 functions as a buffer layer, cushioning stresses between the substrate 101 and the nitride layer 103. The nitride layer 103 typically comprises silicon nitride formed by deposition technique such as CVD, plasma enhance chemical vapor deposition (PECVD), atomic layer deposition (ALD), and/or other suitable deposition techniques. In an embodiment, the nitride layer 103 is formed at a thickness about 200 Å to 1500 Å.

Figure 3:
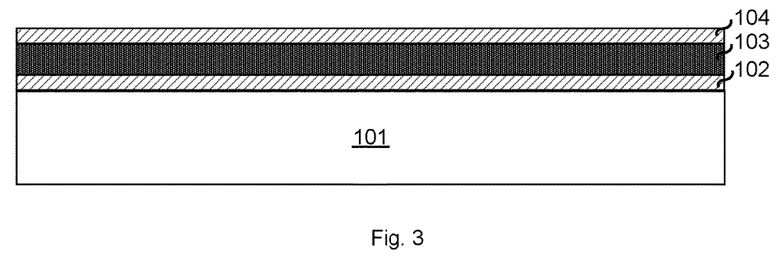
Figure 4:
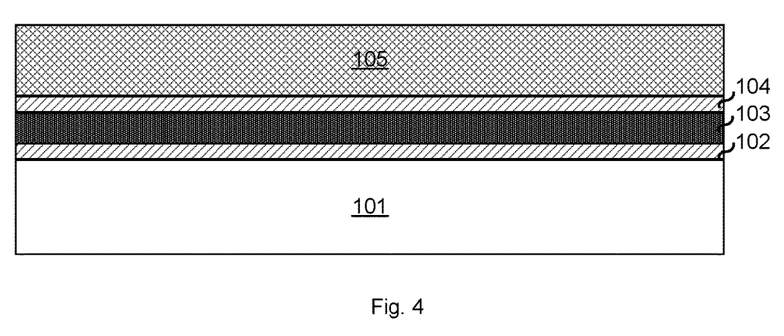

Next, referring to FIG. 3, a second pad oxide 104 is formed on the nitride layer 103 by deposition technique such as CVD. In an embodiment, the second pad oxide layer 104 is as thick as the first pad oxide layer 102. Subsequently, a poly layer 105 is deposited on the second pad oxide layer 104. A thickness of the poly layer 105 is in the range form, but not limited to 500 Å to 5000 Å. In FIG. 4, the resulting structure after the deposition of the poly layer 104 is shown.

Figure 5:
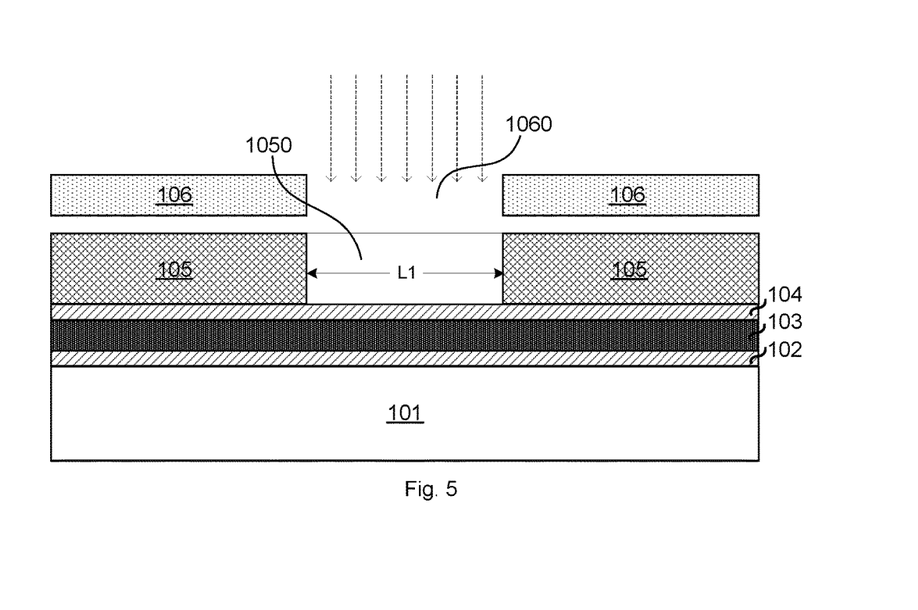

A thermally grown oxide (TGO) mask 106 is provided upon the deposited poly layer 105 having a pattern defined, e.g. by opening 1060 over thick gate oxide region of a MOS device. Referring to FIG. 5, by using a dry etch method, the poly layer 105 is etched with TGO mask 106 to form an opening 1050, typically having a width L1 substantially corresponding to the width of opening 1060 in TGO mask 106. The dry etch can be stopped when the second pad oxide layer 104 is reached. In an embodiment, the width L1 is determined by the characteristics the MOS device demand, such as breakdown voltage or other suitable device characteristic.

Figure 6:
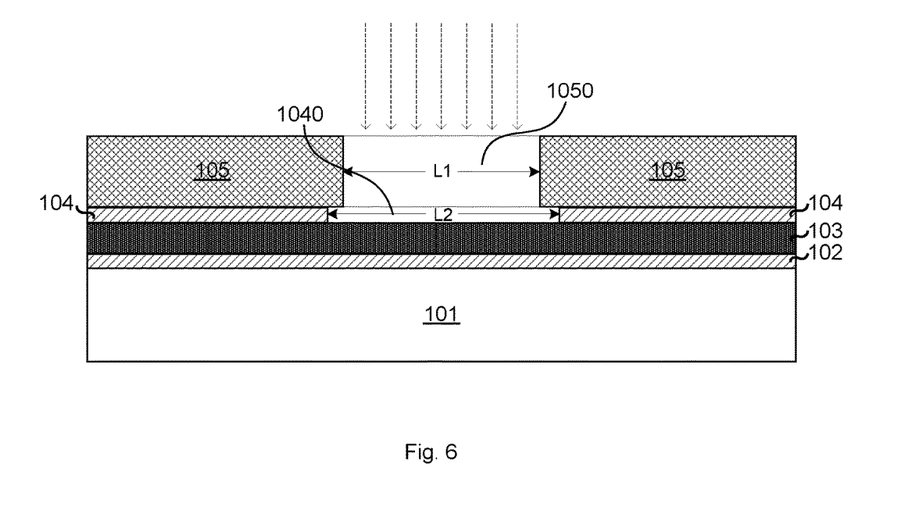

Afterwards, a first isotropic etch (wet or dry) can be conducted through the opening 1050 in the poly layer 105 to selectively attack the second pad oxide layer 104, to remove the portion of the second pad oxide layer 104 beneath the opening 1050, and to create an opening 1040 having a width L2 greater than the width L1. In FIG. 6, the resulting structure after etching of the second pad oxide layer 104 is shown. As can be seen, a trench with stepped structure has been formed after the portion of the second pad oxide layer 104 that extend underneath the poly layer 105 is removed. The first isotropic etch can be used that selectively etch the second pad oxide layer 104 but that have relatively little effect on the poly layer 105.

Figure 7:
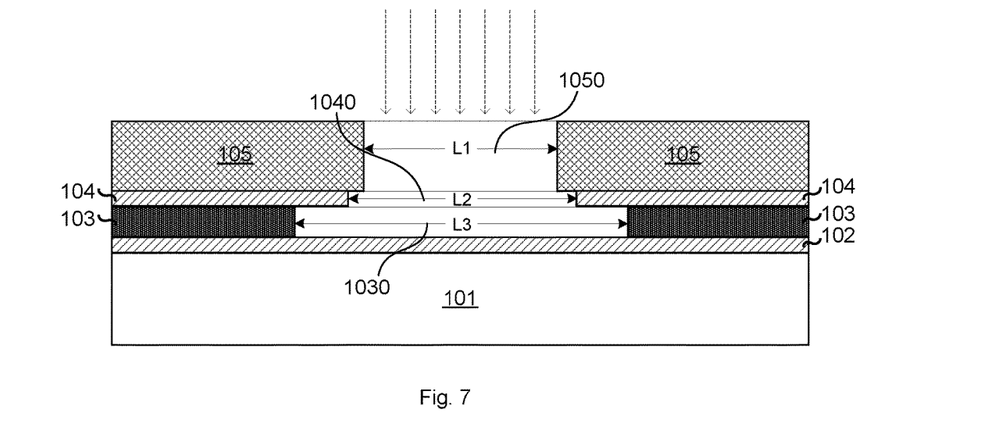

Next, a second isotropic etch can be further conducted through the opening 1050 in the poly layer 105 to selectively etch the nitride layer 103, to remove the portion of the nitride layer 103 beneath the opening 1040, and to further create an opening 1030 having a width L3 greater than the width L2, thereby expanding the stepped trench, so that a surface of the first pad oxide layer 102 corresponding to thick gate oxide region of a MOS device is exposed, as shown in FIG. 7. In an embodiment, the second isotropic etch is selectively etching the nitride layer 103, without damaging the underlying or above pad oxide layers 102 and 104. In another embodiment, the second isotropic etch is highly selective, which means that it etches the nitride layer 103 at a much faster rate than it etches the pad oxide layers 102 and 104. In an embodiment, the width L2 and L3 depends on the etching condition, such as etching time.

Figure 8:
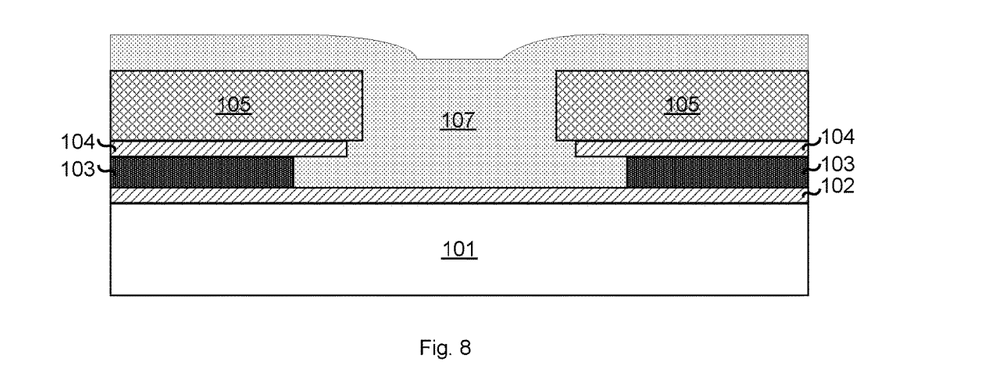

Subsequently, the stepped trench formed by combining the openings 1030, 1040 and 1050 is filled with a dielectric material to create a dielectric layer 107, as shown in FIG. 8. Such dielectric material can comprise oxide derived from TEOS (tetraethyl orthosilicate) or oxide derived from BPSG (boro-phospho-silicate glass). Alternatively, the stepped trench can be filled with any other oxide of the gate dielectric material. In an embodiment, the dielectric layer 107 is hardened and reflowed using a densification process and a high temperature reflow process so as to completely fill the stepped trench formed by openings 1030~1050 and to hold up the following oxide etches. In this process, the dielectric material may be deposited full layer, thereby also being deposited onto a surface of the poly layer 105.

Figure 9:
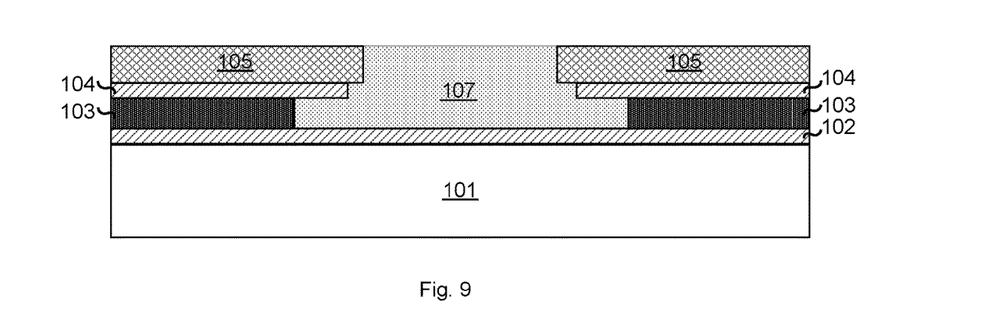

Then referring to FIG. 9, subsequent to stepped trench filling, the dielectric material deposited above the surface of the poly layer 105 is removed and planarization is effected resulting in a substantially flat surface. Any technique known in the art may be used to remove the dielectric material, such as a blank etch, chemical mechanical polish (CMP), etc. In a further embodiment, planarization does not need to stop at the surface of the poly layer 105 if the deposited poly layer 105 is thick. In this case, for example, thinning the dielectric layer 107 and the poly layer 105 can be performed with different CMP slurry or ceria slurry, thereby controlling initially the thickness of the higher step for the stepped oxide. In this process, it is preferable that a surface of the dielectric layer 107 becomes to be the same level as a surface of the poly layer 105.

Figure 10:
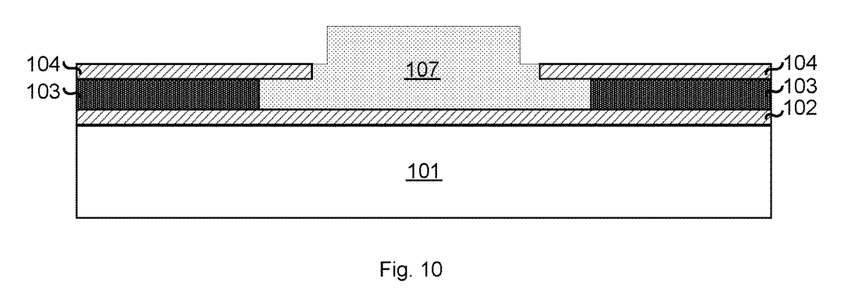

Next, the remaining poly layer 105 is removed, using the dielectric layer 107 as a mask to provide the higher step having a thickness equal with that of the remaining poly layer 105, as shown in FIG. 10. An isotropic dry etch may be used to strip the remaining poly layer 105.

Figure 11:
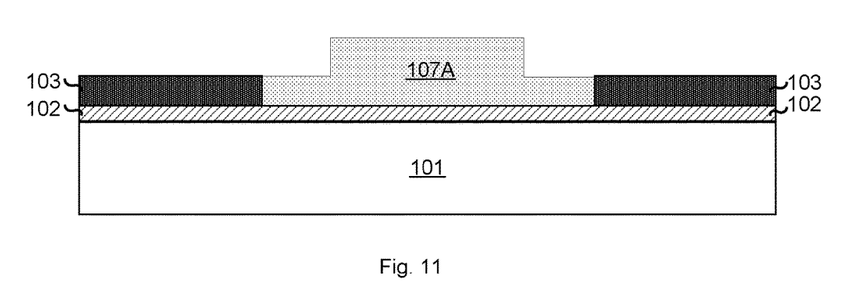

After removing the remaining poly layer 105, the remaining second pad oxide layer 104 is etched to remove until the nitride layer 103 is reached. In an embodiment, during the etching to remove the remaining second pad oxide layer 104, the portion of the dielectric layer 107 uncovered by the second pad oxide layer 104 in FIG. 10 may be also thinned because both the second pad oxide layer 104 and the dielectric layer 107 comprise oxide. In FIG. 11, the resulting dielectric layer 107A having two steps after etching of the second pad oxide layer 104 is shown. As can be seen, a surface of the thinner portion of the dielectric layer 107A becomes to be the same level as a surface of the nitride layer 103. In a further embodiment, the thickness of the dielectric layer 107A may be controlled by controlling the etching condition of FIG. 11, it is equal or lower than the thickness difference between the dielectric layer 107 and the second pad oxide layer 104.

Figure 12:
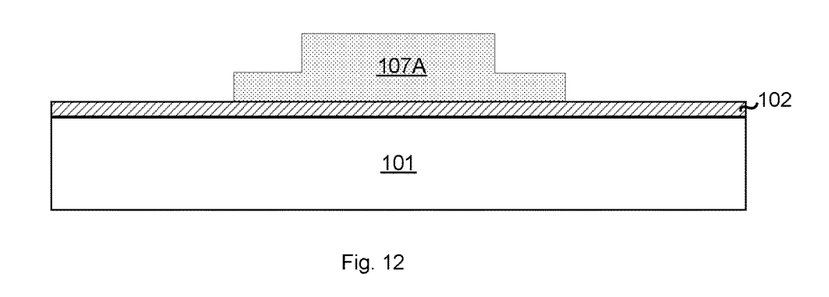

Referring to FIG. 12, after removing the remaining second pad oxide layer 104, the remaining nitride layer 103 is removed. In an embodiment, the hot phosphoric acid may be used to etch the remaining nitride layer 103.

Figure 13:
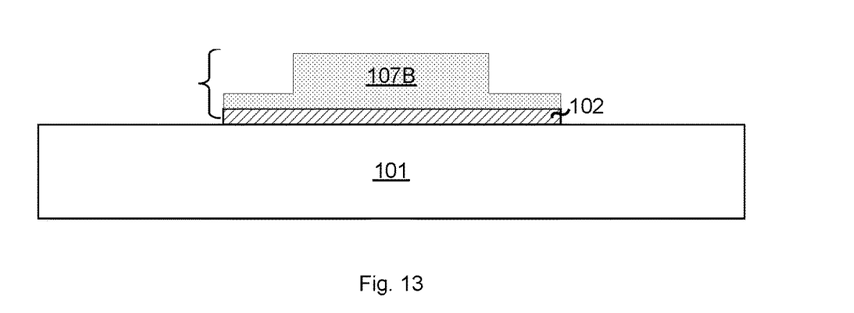

Then referring to FIG. 13, the portion of the first pad oxide layer 104 uncovered by the dielectric layer 107A is etched until the substrate 101 is reached. Similar to FIG. 11, during the etching to remove the first pad oxide layer 102 uncovered by the dielectric layer 107A, the upper portion of the stepped dielectric layer 107A may be also etched, the removed portion may have a thickness equal to the thickness of the first pad oxide layer 102. In FIG. 13, the resulting dielectric layer 107B after etching of the first pad oxide layer 102 is shown. As can be seen, two oxide layers, namely, the remaining first pad oxide layer 102 and the dielectric layer 107B, are formed on the substrate 101. In a further embodiment, the thickness of the dielectric layer 107B may be controlled by controlling the etching condition of the first pad oxide layer 102. In an embodiment, the thickness of the dielectric layer 107B is equal or lower than the thickness difference between the dielectric layer 107A and the first pad oxide layer 102.

As shown in FIG. 13, a stepped oxide 108 can already be recognized and is actually a layer formed by combining the remaining first pad oxide layer 102 and the dielectric layer 107B. The stepped oxide 108 has a thicker portion with a first thickness and a thinner portion with a second thickness. The first thickness is equal the thickness sum of the first pad oxide layer 102 and the dielectric layer 107B. In an embodiment, the first thickness can be established by changing the thickness of the dielectric layer 107B in the etching of FIG. 13 or pre-adjusted by changing the thickness of the dielectric layer 107A in the etching of FIG. 11 and/or the thickness of the dielectric layer 107 in the thinning of FIG. 9. In an embodiment, the second thickness can be established by changing the thickness of the nitride layer 103. In addition, the width of the higher step for the stepped oxide 108 is determined by the width L1 of the opening 1050, while the width of the lower step is determined by the width L1 and the width L3 of the opening 1030. Thus, the size of the stepped oxide 108 is easily controlled according to the embodiments of the present invention.

Generally, a high voltage device requires a thick gate oxide to withstand the high voltage operation environment, while a thin gate oxide in a low voltage device can well withstand the low voltage operation environment. The present invention can be used to manufacture devices that have a stepped thick gate oxide. The stepped oxide 108 is formed to obtain a stepped thick gate oxide in line with the step thickness meeting the technological requirements. Furthermore, the stepped oxide 108 can be formed at a thickness up to 3000 Å so as to withstand 45-60V or even higher voltage over the prior art.

Additionally, during the progression of manufacturing steps in forming a stepped oxide 108 shown in FIGS. 1-13, only the etching of the poly layer 105 to form an opening 1050 needs a mask 106, significantly reducing the numbers of the mask and saving the cost over the prior art.

Figure 14:
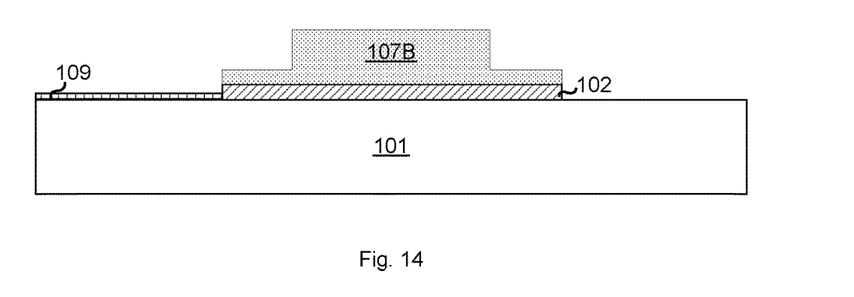
FIG. 14 is a cross-sectional view showing the step in forming a thin gate oxide 109 after forming the stepped thick gate oxide 108 on the substrate according to an embodiment of the present invention.

As described above, the remaining dielectric layer 107B together with the remaining first pad oxide layer 102 forms the stepped oxide 108 which functions as a thick gate oxide of a MOS device. FIG. 14 is a cross-sectional view showing the step in forming a thin gate oxide 109 after forming the stepped thick gate oxide 108 on the substrate according to an embodiment of the present invention. After the stepped thick gate oxide 108 is complete, a thin gate oxide 109 is formed on the substrate of a low voltage device region, as shown in FIG. 14. The thin gate oxide 109 is, for example, silicon oxide, and the method of forming the same way include performing a thermal oxidation process, a chemical vapor deposition (CVD) process or other suitable methods. Consequently, different device areas in BCD process will have different gate oxide thickness, and therefore able to provide the characteristics each type of devices demand. However, it should be noted that before depositing any gate oxide, a number of prior steps required for creating necessary device characteristics in different device areas in BCD process are usually performed.

Figure 15:
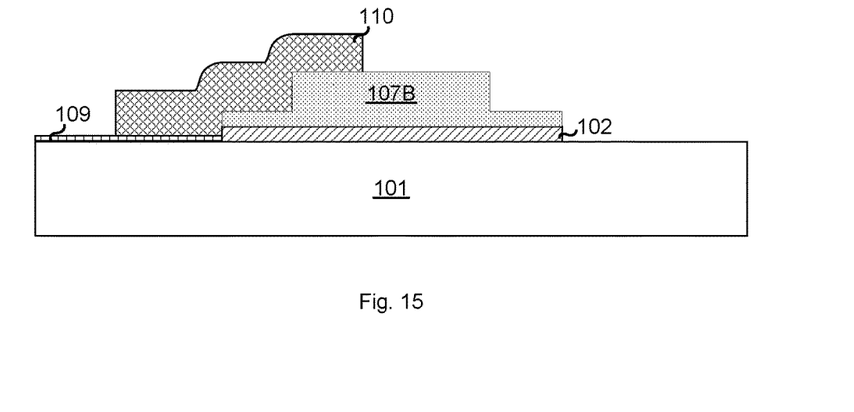
FIG. 15 is a cross-sectional view showing the step in forming a conducting layer 110 after forming the thin gate oxide 109 and thick gate oxide 108 according to an embodiment of the present invention.

FIG. 15 is a cross-sectional view showing the step in forming a conducting layer 110 after forming the thin gate oxide 109 and thick gate oxide 108 according to an embodiment of the present invention. As shown in FIG. 15, an electrically conducting layer 110 is deposited on to the thin and thick gate oxide 109 and 108, where the material of the conductive layer 110 can be, for example, doped polysilicon. The conducting layer functions as poly gate of the MOS device.

Although the above method has been described on the basis of the production of a thick gate oxide for a MOS transistor, the present invention is not limited hereto, but rather finds its application in all semiconductor structures in which stepped oxide are required.

Figure 16:
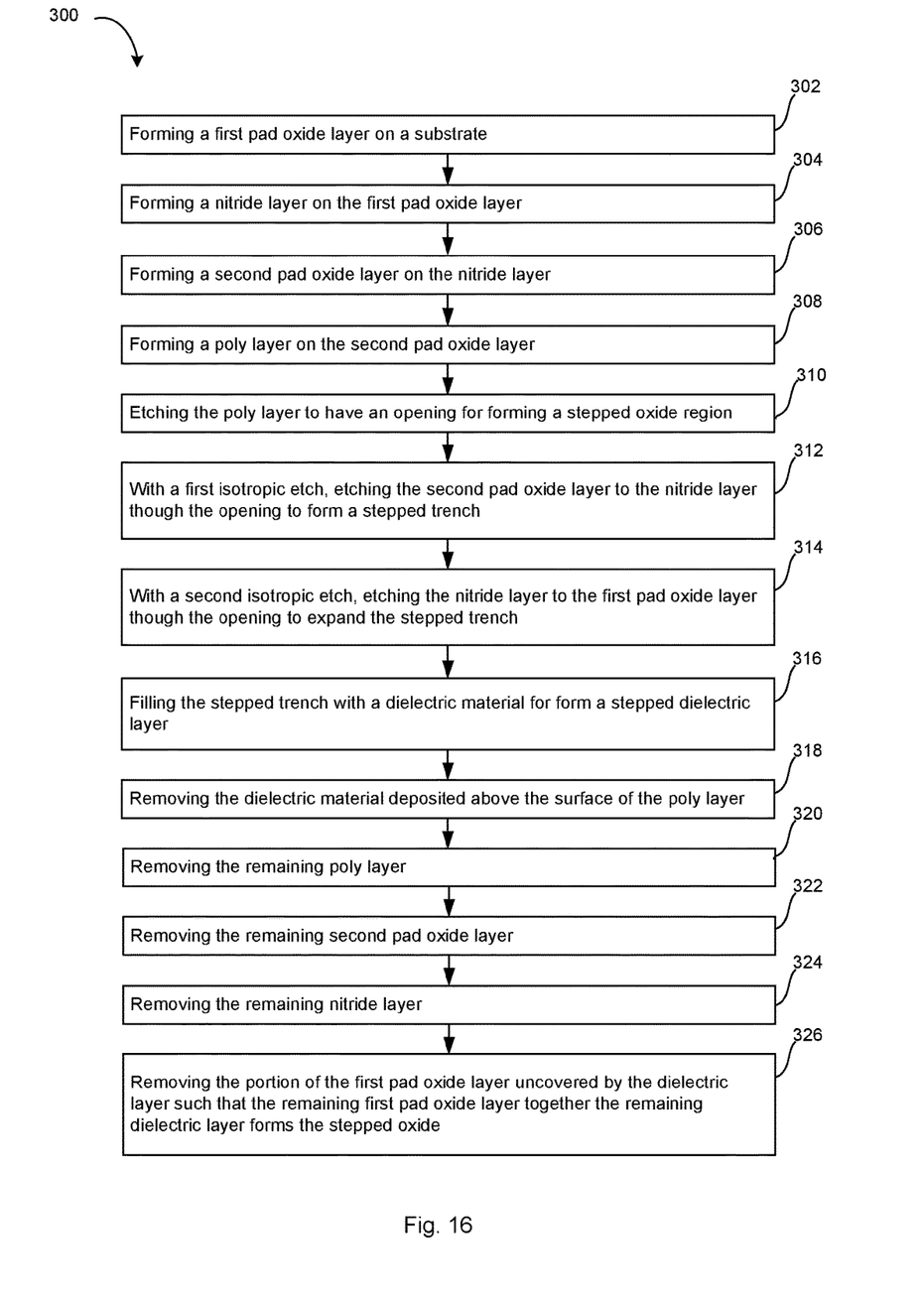
FIG. 16 is a flow chart of a method 300 for forming a stepped oxide on a substrate according to an embodiment of the present invention.

FIG. 16 is a flow chart of a method 300 for forming a stepped oxide according to an embodiment of the present invention. The method 300 comprises steps S302~S326.

At first, at step S302, a first pad oxide layer is formed on a substrate. Next, at step S304, a nitride layer is formed on the first pad oxide layer. Subsequently, at step S306, a second pad oxide layer is formed on the nitride layer. Then at step S308, a poly layer is formed on the second pad oxide layer.

After that, at step S310, the poly layer is etched to have an opening for the stepped oxide region, by using a dry etching method with a mask.

Thereafter, at step S312, the second pad oxide layer is etched to the nitride layer through the opening in the poly layer with a first isotropic etch to form a stepped trench.

Then at step S314, the nitride layer is etched to the first pad oxide layer through the opening in the poly layer with a second isotropic etch to expand the stepped trench.

Next, at step S316, the stepped trench is filled with a dielectric material to form a stepped dielectric layer. In an embodiment, the dielectric material oxide derived from TEOS or oxide derived from BPSG. In an embodiment, the step 316 further comprises a densification process and a high temperature reflow process so as to completely fill the stepped trench and to hold up the following oxide etches.

Subsequently, at step S318, the dielectric material deposited on the surface of the poly layer is removed. In an embodiment, planarization is effected resulting in a substantially flat surface.

After that, at step S320, the remaining poly layer is removed. Afterwards, at step 322, the remaining second pad oxide layer is removed. Next, at step 324, the remaining nitride layer is removed.

Finally, at step 326, the portion of the first pad oxide layer uncovered by the dielectric layer is removed such that the remaining dielectric layer together with the remaining first pad oxide layer forms the stepped oxide.

The formed stepped oxide has a thicker portion with a first thickness and a thinner portion with a second thickness. In an embodiment, before step S320, the first thickness can be adjusted by thinning the poly layer and the dielectric layer using CMP. In this process, it is preferable that a surface of the dielectric layer 107 becomes to be the same level as a surface of the poly layer 105. Between step 320 and step S324, the first thickness can be adjusted by controlling the thickness of the dielectric layer via controlling the etching condition of the remaining second pad oxide layer. After step 324, the first and second thickness can be established by the controlling the thickness of the dielectric layer via controlling the etching condition of the first pad oxide layer.

In an embodiment, the two pad oxide layers, namely the first and second pad oxide layers, have same thickness, and the second thickness is determined by the thickness of the nitride layer.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language.

The present invention is not limited to the above-described production steps. Depending on the stepped oxide to be created, individual steps may be modified or omitted, or other steps may be inserted.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A method for forming a stepped oxide on a substrate, wherein the stepped oxide has a thicker portion with a first thickness and a thinner portion with a second thickness, comprising:
   forming a first pad oxide layer on the substrate;
   forming a nitride layer on the first pad oxide layer;
   forming a second pad oxide layer on the nitride layer;
   forming a poly layer on the second pad oxide layer;
   etching the poly layer to have an opening for forming a stepped oxide region;
   isotropically etching to the second pad oxide layer to the nitride layer through the opening and to form a stepped trench;
   isotropically etching the nitride layer to the first pad oxide layer through the opening to expand the stepped trench;
   filling the stepped trench with a dielectric material to form a dielectric layer;
   removing dielectric material deposited on the surface of the ploy layer;
   removing the remaining poly layer;
   removing the remaining second pad oxide layer;
   removing the remaining nitride layer; and
   removing the portion of the first pad oxide layer uncovered by the dielectric layer such that the remaining dielectric layer together with the remaining first pad oxide layer forms the stepped oxide.

2. The method of claim 1, wherein the opening in the poly layer is formed by a dry etch with a mask.

3. The method of claim 1, wherein the dielectric material comprises oxide derived from TEOS or oxide derived from BPSG.

4. The method of claim 1, wherein filling the stepped trench further comprises a densification process and a high temperature reflow process.

5. The method of claim 1, wherein removing the remaining poly layer comprise an isotropic dry etch.

6. The method of claim 1, wherein the nitride layer is formed at a thickness of 200 Å to 1500 Å.

7. The method of claim 1, wherein the poly layer is formed at a thickness of 500 Å to 5000 Å.

8. The method of claim 1, wherein the first thickness is adjusted by thinning the poly layer and the dielectric layer.

9. The method of claim 1, wherein the first thickness is adjusted by controlling the thickness of the remaining dielectric layer via controlling the condition of etching to remove the remaining second pad oxide layer.

10. The method of claim 1, wherein the first and second thickness are established by controlling the thickness of the remaining dielectric layer via controlling the condition of etching to remove the first pad oxide layer.

11. The method of claim 1, wherein the stepped oxide is a thick gate oxide of a MOS device.

12. A method for forming a stepped oxide on a substrate, wherein the stepped oxide has a thicker portion with a first thickness and a thinner portion with a second thickness, comprising:
   forming a first pad oxide layer on the substrate;
   forming a nitride layer on the first pad oxide layer;
   forming a second pad oxide layer on the nitride layer;
   forming a poly layer on the second pad oxide layer;
   etching the poly layer to have a first opening in the poly layer;
   etching to remove the portion of the second pad oxide layer beneath the first opening through the first opening and to form a second opening in the second pad oxide layer, wherein the second opening width is greater than the first opening width;
   etching the nitride layer through the first opening to remove the portion of the nitride layer beneath the second opening, and to provide a third opening in the nitride layer, wherein the third opening width is greater than the second opening width;
   filling the stepped trench formed by the first, second and third openings with dielectric material to form a stepped dielectric layer;
   removing the dielectric material deposited on the surface of the ploy layer;
   removing the remaining poly layer;
   etching to remove the remaining second pad oxide layer;
   removing the remaining nitride layer; and
   etching to remove the portion of the first pad oxide uncovered by the dielectric layer such that the remaining dielectric layer together with the remaining first pad oxide layer forms the stepped oxide.

13. The method of claim 12, wherein the opening in the poly layer is formed by a dry etch with a mask.

14. The method of claim 12, wherein the dielectric material comprises oxide derived from TEOS or oxide derived from BPSG.

15. The method of claim 12, wherein filling the stepped trench further comprises a densification process and a high temperature reflow process.

16. The method of claim 12, wherein removing the remaining poly layer comprise an isotropic dry etch.

17. The method of claim 12, wherein the nitride layer is formed at a thickness of 200 Å to 1500 Å.

18. The method of claim 12, wherein the poly layer is formed at a thickness of 500 Å to 5000 Å.

19. The method of claim 12, wherein the first thickness is adjusted by thinning the poly layer and the dielectric layer.

20. The method of claim 12, wherein the first thickness is adjusted by controlling the thickness of the remaining dielectric layer via controlling the etching condition of the remaining second pad oxide layer.

21. The method of claim 12, wherein the first and second thickness are established by controlling the thickness of the remaining dielectric layer via controlling the etching condition of the first pad oxide layer.

22. The method of claim 12, wherein the stepped oxide is a thick gate oxide of a MOS device.

* * * * *